United States Patent [19]

Yamashita et al.

[11] Patent Number: 5,009,958

[45] Date of Patent: Apr. 23, 1991

[54] FUNCTIONAL DEVICES COMPRISING A CHARGE TRANSFER COMPLEX LAYER

[75] Inventors: Akio Yamashita, Kanagawa; Susumu Yoshimura, Yokohama; Sohji Tsuchiya, Kanagawa, all of Japan

[73] Assignee: Matsushita Electric Industrial Co., Ltd., Japan

[21] Appl. No.: 170,025

[22] Filed: Mar. 4, 1988

[30] Foreign Application Priority Data

| Mar. 6, 1987 | [JP] | Japan | 62-52537 |
| Mar. 6, 1987 | [JP] | Japan | 62-52538 |
| May 14, 1987 | [JP] | Japan | 62-117353 |

[51] Int. Cl.⁵ ............................ B32B 9/04
[52] U.S. Cl. .................. 428/411.1; 428/418; 428/457; 428/460; 428/469; 428/432; 357/8; 357/30
[58] Field of Search ............ 428/411.1, 415, 416, 428/417, 418, 432, 457, 460, 469; 357/8, 30

[56] References Cited

U.S. PATENT DOCUMENTS

| 4,147,862 | 4/1979 | Hayami et al. | 542/415 |
| 4,652,894 | 3/1987 | Potember et al. | 357/1 |
| 4,672,265 | 6/1987 | Eguchi et al. | 313/506 |
| 4,758,381 | 7/1988 | Suga et al. | 552/303 |
| 4,803,011 | 2/1989 | Barraud et al. | 428/411.1 |
| 4,818,616 | 4/1989 | Milverton et al. | 428/411.1 |

Primary Examiner—George F. Lesmes
Assistant Examiner—Christopher Brown
Attorney, Agent, or Firm—Lowe, Price, LeBlanc, Becker & Shur

[57] ABSTRACT

Functional devices using charge transfer complexes formed as a layer on a substrate. In one embodiment of the invention, the device comprises a substrate, an electrode layer formed on one side of the substrate, at least one layer of a charge transfer complex capable of undergoing a variation in charge transferability by application of external energy, and another electrode layer formed on the complex layer. The charge transfer complex consists essentially of an electron donor and an electron acceptor, at least one of which is an organic compound having a long-chain alkyl substituent. In another embodiment, a charge transfer complex layer is provided on a substrate as polarized in one direction, in which the charge transfer complex does not necessarily contain such a substituted donor or acceptor compound as in the first embodiment but ordinary charge transfer complexes may be used. A pair of electrodes may be provided to sandwich the complex layer therebetween.

12 Claims, 3 Drawing Sheets

10

FUNCTIONAL DEVICES COMPRISING A CHARGE TRANSFER COMPLEX LAYER

BACKGROUND OF THE INVENTION

1. Field of the Invention

This invention relates to the use of charge transfer complexes and more particularly, to functional devices using such complexes in which variations of electric, optical or electromagnetic characteristics in the device are utilized when external energy such as electric, optical or electromagnetic energy, pressure and/or temperature is applied to the device. The functional device can be utilized by itself or in combination with other devices as switching devices, electric and optical memories, optical devices utilizing optical waveguide, a photovoltaic effect and photoconductivity, display devices and sensors.

2. Description of the Prior Art

As is well known in the art, organic charge transfer complexes have wide utility in various fields in which their specific characteristics including electric conductivity or semiconductivity, electromotive force, dielectric properties, photoconductivity or the like are utilized. For instance, the complexes are utilized as polarized or ionized. Alternatively, a neutral to ionic phase change of these complexes are used to make various electric, electronic, optical or electromagnetic devices.

It is known that a certain type of organic molecule crystal undergoes a phase transition of from a neutral crystal which may be a van der Waals crystal to an ionized crystal wherein most constituent molecules are substantially ionized. For instance, it has been found that a single crystal of a charge transfer complex, for example, of tetrathiafulvalene (TTF) and chloranyl (CA) undergoes the phase transition at a relatively low pressure of about 10 Kbar. In addition, when the temperature is lowered down to not higher than 80° K. even at a normal pressure, this single crystal undergoes the neutral-ionic phase transition. The neutral-ionic phase transition is considered to result from the balance between an energy loss of $I_D - E_A$ wherein $I_D$ is an ionization potential and $E_A$ is an electron affinity and a gain of the Madelung energy, aV wherein "a" is a Madelung constant and V is a coulomb energy of a $D^+A^-$ pair wherein D is an electron donor and A is an electron acceptor in case where the electron donor and the electron acceptor are converted from a neutral state $(D°A°)$ into an ionized state $(D^+A^-)$. If $I_D - E_A > aV$, the complex is neutral and if $I_D - E_A < aV$, the complex is ionized. In this connection, however, it has been recently found that the neutral to ionic phase transition does not occur only by a simple change in the Madelung energy, but is greatly influenced by the charge transfer interaction between the donor and acceptor molecules and also by the electron-lattice interaction. For instance, the neutral-ionic phase transition of crystals of tetrathiafulvalene and chloranyl caused by application of temperature or pressure is accompanied by the dimerization lattice strain. This means that aside from the energy balance depending upon the coulomb force, the electron-lattice interaction which will cause Peierls deformation is important.

On the other hand, a Cu and tetracyanoquinodimethane (which may be hereinafter referred to simply as TCNQ) complex is considered to undergo the neutral-ionic phase transition at room temperature under normal pressures. This complex may be formed by dissolving TCNQ in acetonitrile and subjecting the solution to reaction with Cu. When the complex is sandwiched, as a layer, between Cu and Al electrodes and is applied with a voltage, a switching phenomenon is observed where the resistance is kept high by application of a voltage up to a certain voltage, and becomes low when the applied voltage exceeds the level. Presumably, this is because $(Cu^+TCNQ^-)_n$ is converted into a neutral phase where $Cu_x°$ and $(TCNQ°)_x$ are formed. This ionic to neutral phase change may be caused by application of light.

With the organic molecule crystals such as, for example, of tetrathiafulvalene and chloranyl, however, low temperatures or application of high voltages is necessary to cause the phase transition to proceed.

On the other hand, crystals of $(Cu^+TCNQ^-)_n$ which undergo the phase transition at normal temperatures and pressures are relatively unstable and are not reliable with respect to reproducibility. In addition, it has been reported that the reason why the electric conductivity increases after the transition to the neutral phase by the switching phenomenon is due to an increase in amount of the Cu in the charge transfer complex because of the evaporation of the TCNQ molecules caused by the Joule heat. Accordingly, the reproducibility of the switching phenomenon is not necessarily reliable, thus presenting a practical problem in application of the complex as a function device.

On the other hand, charge transfer complexes consisting of electron donors and acceptors are, in most cases, applied using their inherent electric, optical and physical properties without use of such a specific phase transition as described above. For instance, many reports have been made with respect to conductivity, electromotive force, dielectric properties and photoconductivity of charge transfer complexes. However, these complexes are usually polarized isotropically. When the direction of polarization is isotropic, any electric charge induced by the polarization do not produce, or the photovoltaic force is offset and lessened. In addition, dielectric characteristics are also offset.

SUMMARY OF THE INVENTION

It is an object of the invention to provide a functional device which makes use of a charge transfer complex of a specific type whereby the neutral-ionic or ionic-neutral phase transition can be caused to proceed stably and reproducibly.

It is another object of the invention to provide a functional device in which a charge transfer complex used consists of an electron donor and an electron acceptor, at least one of which has a long chain alkyl substituent whereby the charge transfer complex undergoes a stable neutral-ionic phase transition at normal temperatures and normal pressures by application of external energy.

It is a further object of the invention to provide a functional device which comprises a layer of a charge transfer complex which is polarized in one direction, so that optical or electric or other physical properties of the layer are significantly improved upon application of external energy.

In accordance with one embodiment of the invention, there is provided a functional device which comprises a substrate, an electrode layer formed on one side of the substrate, at least one layer of a charge transfer complex capable of undergoing a variation in charge transferability by application of external energy, and another electrode layer formed on the complex layer. In the device, the charge transfer complex used is made of an electron donor and an electron acceptor, one of which is an organic compound having has a long-chain alkyl substituent. The alkyl substituent has preferably from 10 to 22 carbon atoms. When external energy such as electric, optical or electromagnetic energy is applied to the device, a neutral-ionic or ionic-neutral phase transition takes place in the charge transfer complex layer. This phase transition results in the variation in electric, optical or electromagnetic characteristics. Accordingly, the device may be used as an electric or optical sensor. Alternatively, if the charge transfer complex used undergoes a color change by application of an electric signal, the device may be used as a display device or memory.

In accordance with another embodiment of the invention, there is also provided a functional device which comprises a substrate, and a layer of a charge transfer complex which is formed on one side of the substrate. The charge transfer complex should be polarized in one direction. In this device, the charge transfer complex used may be any known organic charge transfer complexes including not only those used in the first embodiment, but also long-chain alkyl substituent-free charge transfer complexes. This type of functional device may be applied as an optical or display device or a memory. The charge transfer complex layer may be sandwiched between a pair of electrodes. In this arrangement, an electric charge induced by the polarization is produced on the electrodes, resulting in an electromotive force. This force can be increased by application of light.

DETAILED DESCRIPTION AND EMBODIMENTS OF THE INVENTION

Broadly, the functional device according to the invention can be classified into two classes. One class includes a layer of a charge transfer complex which undergoes a neutral-ionic phase transition by application of external energy. This phase transition is effectively utilized as various types of devices including optic, electric, electro-magnetic devices or memories. The other class makes use of polarization of electron donor and acceptor which constitute a charge transfer complex.

In accordance with the first class of the invention, there is provided a functional device which includes a substrate, a first electrode, a layer of a charge transfer complex consisting of an electron donor and an electron acceptor, and a second electrode formed on the substrate in this order. At least one of the electron donor and acceptor should be an organic compound which has a long-chain alkyl substituent. By this, the neutral-ionic phase transition proceeds in a reliable and reproducible fashion upon application of a voltage across the charge transfer complex layer or upon application of a laser beam or by heating the layer. The reason why the substitution of a long-chain alkyl group leads to a stable and reproducible phase transition is considered as follows: the long-chain alkyl group enables the charge transfer complex to have a free steric space which permits the Peierls deformation to occur so as to cause a variation in the Madelung energy to be effectively reproduced. Moreover, the long-chain alkyl group is effective in improving film-forming properties of the charge transfer complex.

Figure 1:
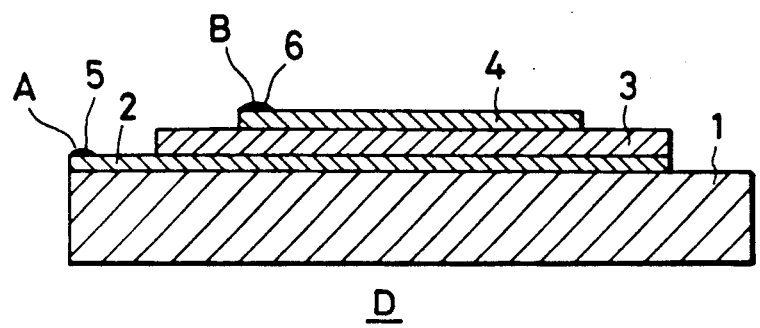
FIG. 1 is a schematic section view of a functional device according to one embodiment of the invention.

Reference is now made to the the accompanying drawings and particularly to FIG. 1. In FIG. 1, there is generally shown a functional device D which includes a substrate 1. The substrate 1 has a transparent electrode 2 such as an indium tin oxide film, a layer 3 of a charge transfer complex of the type which will be described hereinafter, and a counter electrode 4 such as an indium tin oxide film. The electrodes 2 and 4 have, respectively, silver paste connections 5 and 6 having leads A and B. The substrate 1 may be made of glasses, plastic resins, metals or the like. The electrodes 2, 4 are made, for example, of indium tin oxide, tin oxide, gold and the like. For optical purposes, the substrate and the electrodes should be optically transparent. The layer 3 is made of a charge transfer complex of an electron donor and an electron acceptor. For ensuring a reliable and reproducible neutral-ionic phase transition by application of external energy, at least one of the donor and acceptor should be an organic compound having a long-chain alkyl substituents. Examples of the organic compounds free of the alkyl substituent and capable of yielding charge transfer complexes in combination with an electron donor or acceptor include tetracyanoquinodimethane, p-benzoquinone, tetracyanobenzene and the like as an acceptor, and p-hydroquinone, naphthalene anthracene, tetrathiafulvalene, basic dyes and the like as an electron donor. Examples of the basic dyes include Rhodamine, Crystal Violet, Methylene Blue and the like. Other organic donors may be compounds of the following formulae (I) and (II), and various derivatives thereof, capable of developing color by intramolecular ring closure or opening caused by the charge transfer

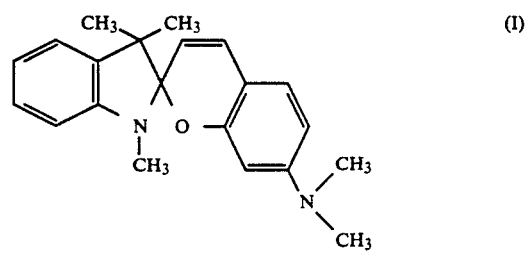

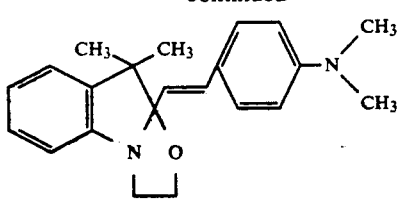

(II)

The compound of the formula (II) is 3,3-dimethyl-1,2-(p-dimethylaminostyryl)indolino[1,2-b]oxazoline. Various derivatives are described, for example, in U.S. Pat. No. 4,147,862 and include 3,3-dimethyl-5-methoxy-2-(p-chlorostyryl)indolino[1,2-b]oxazoline, 3,3-dimethyl-5-chloro-2-(p-dimethylaminostyryl)indolino[1,2-b]oxazoline, 3,3-dimethyl-2-(p-nitrostyryl)indolino[1,2-b]oxazoline, 3,3,5-trimethyl-2-(p-dimethylaminostyryl)indolino[1,2-b]oxazoline, 3,3-dimethyl-5-methoxy-2-(p-chlorostyryl)indolino[1,2-b]oxazoline, and the like.

Although not particularly indicated in this patent, mention is made of useful derivatives of the compound of the formula (I) including 3,3-dimethyl1,2-(p-dimethyl aminocinnamylidenevinyl)indolino[1,2-b]oxazoline and 3,3-dimethyl-1,2-(p-dimethylamino-4-methylcinnamylidenevinyl)indolino[1,2-b]oxazoline. With respect to the compound of the formula (I), similar derivatives can be prepared and used in the practice of the invention.

As a matter of course, metals such as Cu, Ag, a transition metal such as Ti and the like may be used as a donor when the acceptor is a substituted organic compound. On the other hand, a halogen or tetracyanoethylene may be used as an electron acceptor in which case the donor should be an organic compound having a long alkyl substituent.

The above-mentioned organic donors and/or acceptors should have a long-chain alkyl substituent. Typical examples of the substituted donors and acceptors are shown below:

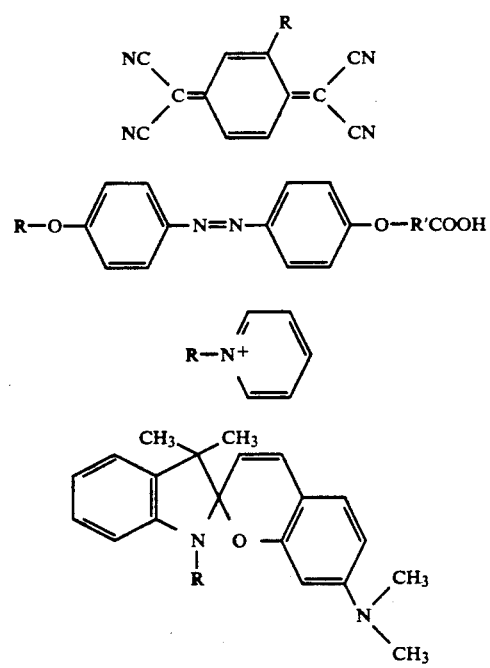

(1)

(2)

(3)

(4)

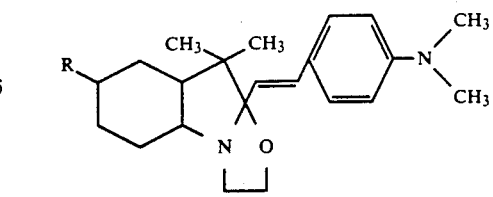

(5)

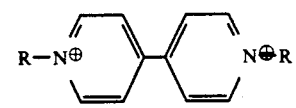

(6)

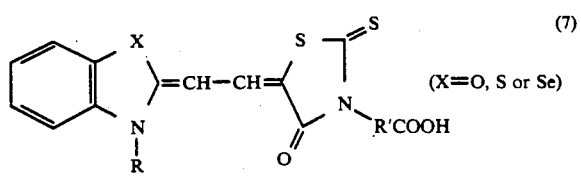

(7)

(X=O, S or Se)

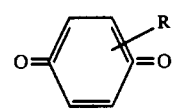

(8)

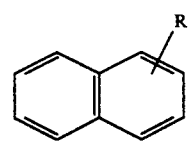

(9)

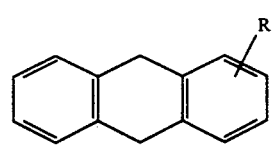

(10)

In the above formulae, each R or R' represents an alkyl group having from 10 to 22 carbon atoms.

The above substituted compounds are know or can be prepared without any difficulty. For instance, the substituted TCNQ (1) is prepared by a process described, for example, in U.S. Pat. No. 3,115,506 in which an alkyl-substituted 1,4-cyclohexanedione is used as a starting material. A long-chain alkyl-substituted 1,4-cyclohexanedione can be prepared by hydrogenation of a long-chain alkyl-substituted hydroquinone. The substituted indolinooxazoline (5) may be obtained by procedures described in the examples of the U.S. Pat. No. 4,147,862.

For ensuring the stable and reproducible phase transition, it is essential that the alkyl substituent be a long chain sufficient to allow a free space. For ease in preparation and economy, the long-chain alkyl group has preferably from 10 to 22 carbon atoms including $C_{10}H_{21}$, $C_{12}H_{25}$, $C_{18}H_{37}$ or $C_{22}H_{45}$. Preferable combinations of the donor and acceptor, at least one of which is substituted with a long-chain alkyl group, include those of the alkyl-substituted TCNQ (1) and Cu or Ag, or the indolinooxazoline compound of the formula (II) or derivatives thereof. Among the derivatives, 3,3-dimethyl1,2-(p-dimethyl aminocinnamylidenevinyl)indolino[1,2-b]oxazoline and 3,3-dimethyl-1,2-(p-dimethylamino-4-methylcinnamylidenevinyl)indolino[1,2-b]oxazoline are preferred because if a bias voltage is applied to a layer of these derivatives, a clear color change occurs from colorless to blue. This color change reversibly proceeds: when the application of the bias voltage is stopped, the layer returns to a colorless state. The compound of the formula (II) likewise undergoes a clear colorless to red color change by application of a bias voltage. Accordingly, the functional devices using the above combinations can provide a display of good quality. Further preferable combinations include those of the substituted oxazoline compound of the formula (5) and unsubstituted TCNQ although other donative compounds indicated before may be used.

For the formation of the functional device D of FIG. 1, for instance, a glass substrate having a transparent indium tin oxide (ITO) electrode is provided, on which a charge transfer complex is formed by deposition and a counter electrode is subsequently formed by ion plating or other known techniques. The charge transfer complex layer is usually formed by subjecting either an organic donor or acceptor to vacuum deposition in a predetermined thickness and then the other to vacuum deposition, followed by heating the superposed layers up to 40° to 150° C. for a time sufficient to form a charge transfer complex. As will be appreciated from the above, the layer 3 may not necessarily be made entirely of a charge transfer complex but may contain a sublayer remaining as an electron donor or acceptor layer. Alternatively, the charge transfer complex may be formed by dissolving electron donor and acceptor in an organic solvent and applying the resulting solution onto the electrode-bearing substrate. Subsequently, the applied layer is heated to temperatures sufficient for the formation of an intended charge transfer complex.

The substrates may be in the form of a sheet, film or plate and the electrodes are usually deposited in a thickness of from 300 to 3000 angstroms. The layer 3 is usually formed in a thickness of from 50 to 10,000 angstroms.

The other class functional devices of the invention are now described with reference to FIGS. 2 through 5.

Figure 2:
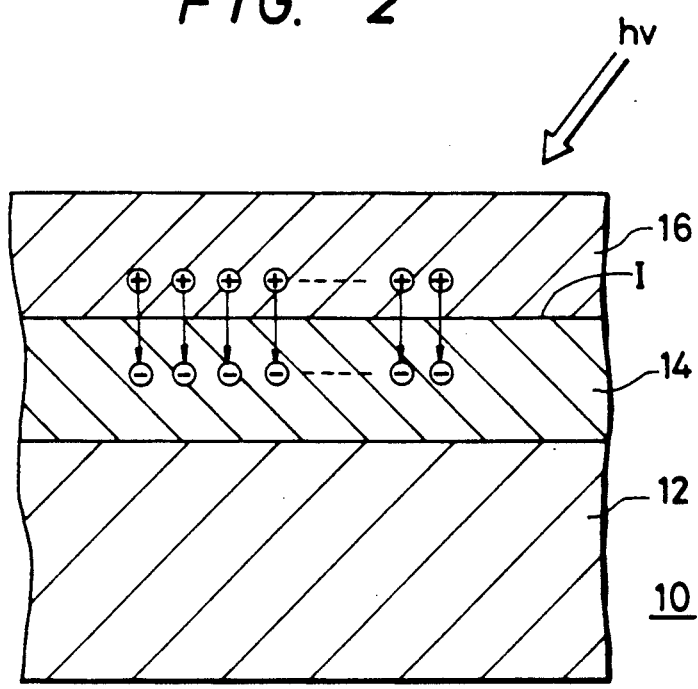
FIG. 2 is a schematic view of a functional device according to another embodiment of the invention.

FIG. 2 shows a functional device according to another embodiment of the invention which is generally indicated by 10. The device 10 includes a substrate 12, an electron acceptor layer 14 and an electron donor layer 16 formed on the substrate 12. The electron acceptor layer 14 and electron donor layer 16 may be reversed in the order. At an interface I between the layers 14 and 16, polarization takes place due to the charge transfer as schematically shown in the figure. In this figure, a strongly polarized charge transfer complex is shown in which dipole moments are arranged in a direction as shown. In this condition, the electric charge induced by the polarization is produced on the surfaces of the respective layers. The amount of the charge can be increased by application of light.

If a laser beam, hv, is passed along the direction of the arrow from the upper right side as viewed in FIG. 2, it is refracted at and passed along the interface for the reason that the interface layer has an increasing refractive index by the influence of the polarization.

Although the charge transfer between a donor and an acceptor may vary depending upon the height and shape of potential peaks of the donor and acceptor used, a complex whose charge transferability is poor will take an atomic arrangement of a substantially neutral molecule for both an acceptor and a donor, thus undergoing vibrations as molecules. As the charge transfer between the donor and acceptor increases, they tend to become ionic in nature and vibrate as such. In either case, polarization takes place more or less.

Figure 3:
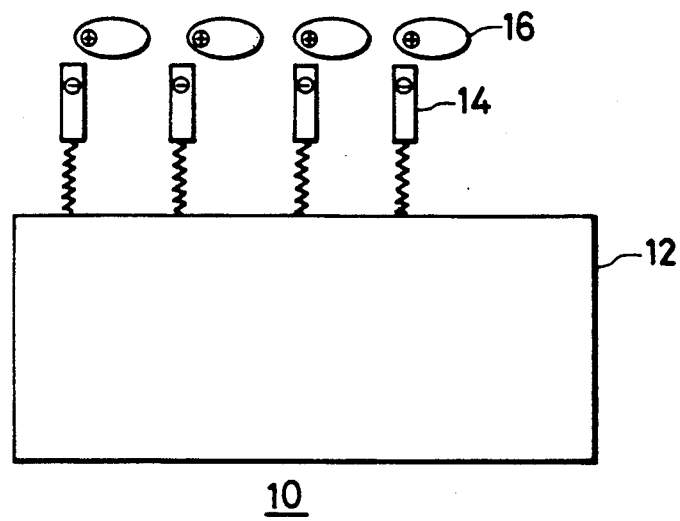
FIG. 3 is a schematic sectional view of a functional device according to a further embodiment of the invention.

In order to make a charge transfer complex polarized in a given direction, donor and acceptor layers are superposed as shown in FIG. 2. Alternatively, a monomolecular layer of a charge transfer complex may be formed on a substrate by the Langmuir-Blodgett method as is schematically shown in FIG. 3. It should be noted that in FIGS. 2 through 5, like reference numerals indicate like parts or members. The device of FIG. 3 has a monomolecular layer of a charge transfer complex which is polarized. In order to enhance the functionality of the layer, it is preferred to form a plurality of the monomolecular layers in such a way that the respective monolayers are polarized in the same direction. This type of device will be particularly described in example appearing hereinafter.

Figure 4:
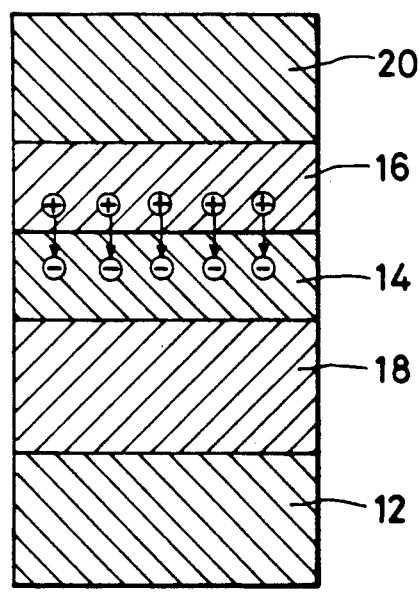
FIG. 4 is a schematic view illustrating a functional device according to a still further embodiment of the invention.
Figure 5:
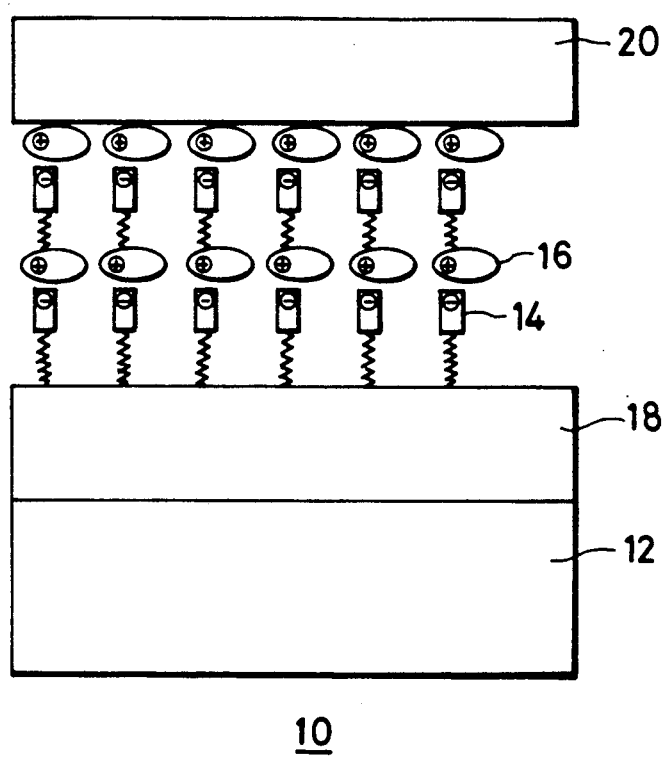
FIG. 5 is a schematic view of a functional device according to another embodiment of the invention.

FIG. 4 shows a functional device, generally indicated by 10, according to a further embodiment of the invention. The functional device of FIG. 4 is similar to the device of FIG. 2 except that the acceptor layer 14 and the donor layer 16 are sandwiched between a pair of electrodes 18 and 20. In this embodiment, polarization takes place at the interface between the acceptor and donor layers 14, 16. As in the case of FIG. 2, if a laser beam is applied to the device from the upper right as viewed in the figure, it passes along the interface for the reason described before. Further, when a bias voltage is applied between the electrodes 18, 20, the refractive index varies to cause optical modulation. FIG. 5 shows a functional device using two monlayers between the electrodes 18, 20.

The devices of FIGS. 2 to 5 may be applied as an optical sensor, an optical waveguide or pressure or other sensors utilizing an induced charge as a variation in capacitance.

The substrates used in the devices of FIGS. 2 to 5 may be in the form of a sheet, film or plate and may be made of glasses, plastic resins, metals and the like. If used, the electrodes may be made of those described with respect to FIG. 1.

The acceptors and donors useful in these embodiments may be not only those described with respect to the first class, but also ordinarily employed compounds. Such compounds are tetracyanoquinodimethane, p-benzoquinone, tetracyanoethylene, tetracyanobenzene and the like used as an acceptor, and p-hydroquinone, naphthalene anthracene and metals such as copper, silver, a transition metal such as titanium and the like as a donor. The basic dyes and the compounds of the formulae (I) and (II) indicated before may be likewise used as a donor. It should be noted that the charge transfer complexes used in this class may not necessarily contain a long-chain alkyl group in at least one of a donor and an acceptor as in the first class embodiment.

In the second class, preferable combinations of donor and acceptors include tetracyanoquinodimethane with or without substitution with a long-chain alkyl group having from 10 to 22 carbon atoms and copper or silver, or the compound of the formula (II) indicated before or a derivative of the compound. Preferable derivatives are those described with respect to the first class embodiment.

The present invention is more particularly described by way of examples.

EXAMPLE 1

This example describes a functional device of the type as shown in FIG. 1.

A glass substrate having a transparent electrode of an indium tin oxide film on one side of the substrate was provided. Tetracyanoquinodimethane (TCNQ) having a $C_{18}H_{37}$ substituent as shown in the following formula

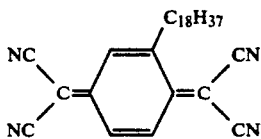

was deposited on the electrode at $10^{-5}$ Torr., in a thickness of 3000 angstroms. Subsequently, copper was subjected to vacuum deposition on the substituted TCNQ film under the same conditions as indicated above in a thickness of 50 angstroms. While keeping the vacuum, the glass substrate having the substituted TCNQ film and the Cu film was heated to 100° C. for 40 minutes including the heating time, thereby forming a $(Cu^+ - TCNQ^-(C_{18}))$ complex layer in the films. An indium titanium oxide film was further formed on the layer by ion plating to obtain a device as shown in FIG. 1.

The device was subjected to visible light and infrared absorption spectroscopic analyses. Formation of the charge transfer complex was confirmed from the visible light absorption spectra including a wide charge transfer band absorption at 600 to 900 nm and a gentle absorption of the TCNQ ion radicals at a longer wavelength side of an absorption of neutral TCNQ at 395 nm. In addition, the infrared absorption analysis revealed the formation: the absorption of neutral TCNQ at 2228 $cm^{-1}$ separated into absorptions at 2202 $cm^{-1}$ and 2162 $cm^{-1}$ and was thus shifted to a lower energy side. Moreover, an absorption at 2162 $cm^{-1}$ became wider. Thus, the formation of the complex salt of the substituted TCNQ and Cu was confirmed.

The device obtained above was allowed to stand in the air, whereupon any changes were not recognized as determined through the visible light spectroscopic analysis. Thus, the device was found to be stable.

With a device using unsubstituted TCNQ as an acceptor, it was found through visible light spectroscopic analysis that part of the charge transfer complex formed was returned into neutral $Cu_x$ and $(TCNQ)_x$ several hours after the fabrication of the device.

Figure 6:
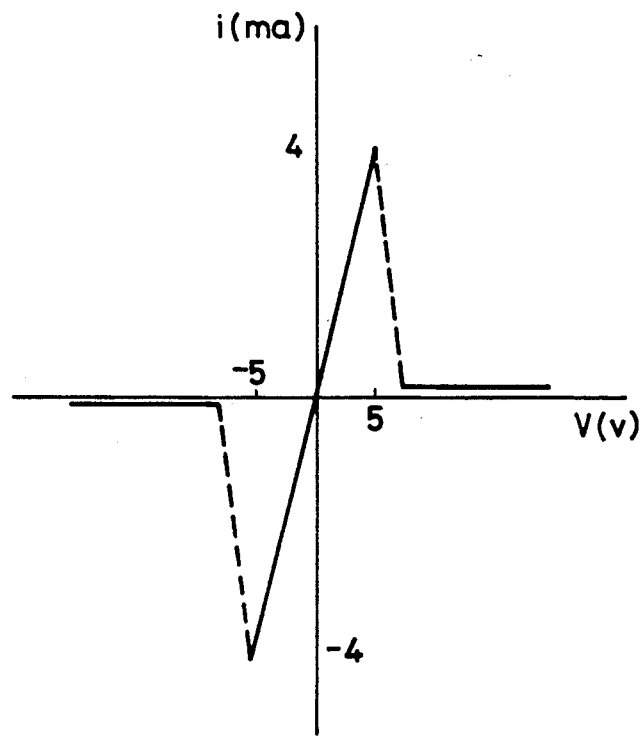
FIG. 6 is a current-voltage characteristic of the functional device obtained in Example 1.

The device obtained in this example was subjected to measurement of a current-voltage characteristic. The characteristic is shown in FIG. 6. From the figure, it will be found that a negative resistance characteristic of the N type is obtained. This characteristic is symmetric irrespective of the polarity of the applied voltage as is particularly shown in FIG. 6. When the bias voltage is turned off, the device returns to an original state or a low resistance level.

The negative resistance characteristic is considered due to the ionic-neutral phase transition occuring as follows:

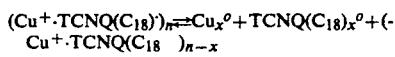

The substituted TCNQ is unlikely to evaporate by the Joule heat as in prior art acceptors or donors, resulting in good reversability of the phase change.

It was confirmed that the above phase transition took place by application of light such as a semiconductor laser beam, whereupon the change transfer band in the visible light spectra disappeared, enabling one to make optical writing.

In addition, it was also found that the phase transition occurred by reducing a pressure or increasing a temperature so as to allow a wider distance between $Cu^+$ and the substituted $TCNQ^-$.

Because the complex salt suffers a sharp variation in magnetic susceptibility between the ionic and neutral phases, the phase transition may be caused by application of a magnetic field.

In the above example, Cu was used as an electron donor, Ag or a transition metal such as Ti could be likewise used. Moreover, the $C_{18}H_{37}$ alkyl substituent was used as a long alkyl group, but use of other alkyl substituents such as $C_{10}H_{21}$, $C_{12}H_{25}$ and $C_{22}H_{45}$ leads to similar results.

The charge transfer complex layer was formed by vacuum deposition, but may be formed by application of a solution of a charge transfer complex onto the substrate or by the Langmuir-Blodgett method.

EXAMPLE 2

This example illustrates a functional device as shown in FIG. 2, in which a charge transfer complex is polarized in a given direction.

A glass substrate was provided, onto which tetracyanoquinodimethane was vacuum deposited in a thickness of 1000 angstroms under conditions of $10^{-5}$ Torr., to form an acceptor layer, followed by vacuum deposition of a dye of the formula (1) indicated before in a thickness of 1000 angstroms to form a donor layer. When the resultant device was allowed to stand at normal temperatures, charge transfer took place at the interface between the acceptor and donor layers as shown in FIG. 2. The C—O bond of the dye is broken as shown in the following formula (III) at the occurrence of the charge transfer, thereby producing a color-developing species.

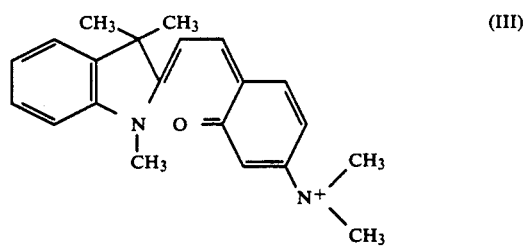

(III)

When an argon laser beam of 530 nm was applied to the superposed layers, it was refracted at the interface and passed therealong. This is considered due to a high refractive index at the charge transferred region.

The charge induced by the polarization can be measured at the surface of the donor layer. When plural acceptor and donor layers are superposed so that the resulting charge transfer complex is polarized in the same direction at the interfaces, an amount of the charge increases.

EXAMPLE 3

Substituted tetracyanoquinodimethane of the following formula (IV)

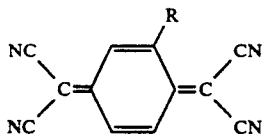

(IV)

in which R represents a $C_{18}H_{37}$ group, and a dye of the formula (II) indicated before were dissolved in chloroform at a molar ratio of 1:1. When the resultant solution was allowed to stand for 30 to 60 minutes, a complex was gradually formed while developing a red color. This solution was developed over a water surface to form a monomolecular layer, followed by deposition on a glass substrate by a horizontal deposition technique. This is schematically shown in FIG. 3, in which the donor 16 is a dye molecule and the acceptor 14 is the substituted TCNQ molecule. The color development is attributed to the breakage of the C—O bond of the dye as shown in the following formula (V)

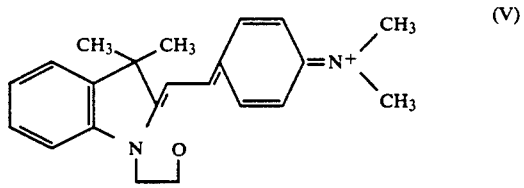

(V)

The absorption spectrum analysis reveals that an absorption maximum appears at 570 nm but the absorption of the substituted TCNQ is rarely observed. From this, it is considered that the molecules of the substituted TCNQ are arranged vertically with respect to the substrate and the dye molecules are arranged parallel as shown in FIG. 3.

The charge induced by the polarization was observed on the surface of the layer. In this case, this charge increases when a plurality of the monomolecular layers are superposed as in Example 2.

In Examples 2 and 3, the acceptor and donor layers are superposed on the substrate in this order but may be reversed.

EXAMPLE 4

The general procedure of Example 2 was repeated except that indium tin oxide electrodes were formed prior to and after the formation of the acceptor and donor layers, each in a thickness of 200 angstroms, thereby obtaining a functional device as schematically shown in FIG. 4. In this case, the induced charge could be measured between the electrodes as an electromotive force. For increasing the electromotive force, a plurality of donor and acceptor layers should be formed to have the same direction of polarization at the respective interfaces.

EXAMPLE 5

The general procedure of Example 3 was repeated except that indium tin oxide electrodes were formed prior to and after the formation of the monolayer, and two monolayers were formed as schematically shown in FIG. 5, thereby obtaining a functional device having the electrodes.

In the devices obtained in Example 4 and 5, the charge transfer complex is arranged as a layer having a given direction of polarization and is sandwiched between electrodes. The charge induced by the polarization can be measured, and increases by application of light. Accordingly, these devices can be used as an optical sensor. Alternatively, the refractive index at the polarized portion increases, so that the devices can be used as an optical waveguide. These functions can be modulated by application of a bias voltage between the electrodes. The devices of the invention have thus wide utility in various fields.

What is claimed is:

1. A functional device which comprises a substrate, an electrode layer formed on one side of the substrate, at least one layer of a charge transfer complex formed on the electrode layer and capable of undergoing a neutral-ionic phase transition and a variation in charge transferability by application of external energy, and another electrode layer formed on the complex layer, said charge transfer complex consisting essentially of an electron donor and an electron acceptor, at least one of which is an organic compound with a long-chain alkyl substituent having from 10 to 22 carbon atoms.

2. A functional device according to claim 1, wherein said electron acceptor is a member selected from the group consisting of tetracyanoquinodimethane, p-benzoquinone, and tetracyanobenzene, each substituted with an alkyl group having from 10 to 22 carbon atoms.

3. A functional device according to claim 1, wherein said electron donor is Cu or Ag and said electron acceptor is tetracyanoquinodimethane substituted with an alkyl group having from 10 to 22 carbon atoms.

4. A functional device according to claim 2, wherein said alkyl group has 18 carbon atoms.

5. A functional device according to claim 1, wherein said electron donor is tetrathiafulvalene and said electron acceptor is tetracyanoquinodimethane substituted with an alkyl group having from 10 to 22 carbon atoms.

6. A functional device according to claim 1, wherein said electron donor is a dye of the following formula (I) or (II) or a derivative thereof

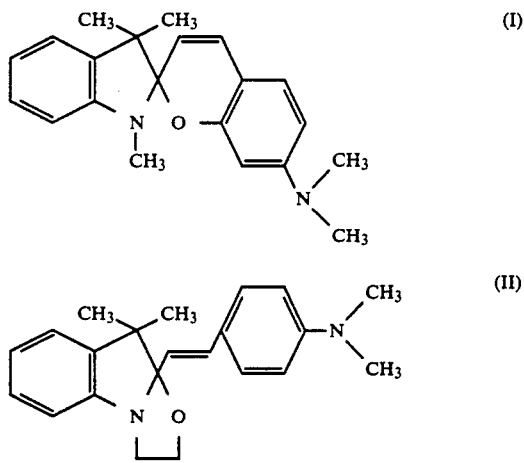

and said electron acceptor is tetracyanoquinodimethane substituted with an alkyl group having from 10 to 22 carbon atoms.

7. A functional device according to claim 6, wherein said electron donor is the dye of the formula (II).

8. A functional device according to claim 6, wherein said electron donor is 3,3-dimethyl-1,2-(p-dimethylaminocinnamylidenevinyl)indolino[1,2-b]oxazoline.

9. A functional device according to claim 6, wherein said electron donor is 3,3-dimethyl-1,2-(p-dimethylamino-4-methyl-cinnamylidenevinyl)indolino[1,2-b]oxazoline.

10. A functional device according to claim 1, wherein said electron donor is a dye of the following formula

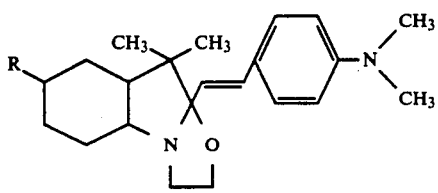

in which R represents an alkyl group having from 10 to 22 carbon atoms, and said electron acceptor is unsubstituted tetracyanoquinodimethane.

11. A functional device according to claim 1, wherein said charge transfer complex consists essentially of copper and tetracyanoquinodimethane substituted with an alkyl group having from 10 to 22 carbon atoms.

12. A functional device which comprises a substrate, at least one layer of a charge transfer complex which is formed on one side of the substrate, and a pair of electrodes sandwiching said at least one layer therebetween, said charge transfer complex being polarized in one direction, said at least one layer is made of an acceptor sub-layer and a donor sub-layer superposed one on another, and said charge transfer complex is formed and polarized at the interface between said acceptor sub-layer and said donor sub-layer.

* * * * *